US007708832B2

United States Patent
Kim et al.

(10) Patent No.: US 7,708,832 B2
(45) Date of Patent: May 4, 2010

(54) METHOD FOR PREPARING SUBSTRATE FOR GROWING GALLIUM NITRIDE AND METHOD FOR PREPARING GALLIUM NITRIDE SUBSTRATE

(75) Inventors: Yong-Jin Kim, Gyeongsangbuk-Do (KR); Ji-Hoon Kim, Gyeonggi-do (KR); Dong-Kun Lee, Gyeongsangbuk-Do (KR); Doo-Soo Kim, Seoul (KR); Ho-Jun Lee, Daegu (KR)

(73) Assignee: Siltron Inc., Gum-si, Gyeongsangbuk-do (KR)

( * ) Notice: Subject to any disclaimer, the term of this patent is extended or adjusted under 35 U.S.C. 154(b) by 0 days.

(21) Appl. No.: 12/177,490

(22) Filed: Jul. 22, 2008

(65) Prior Publication Data

US 2009/0068822 A1  Mar. 12, 2009

(30) Foreign Application Priority Data

Sep. 11, 2007  (KR) ............. 10-2007-0091899

(51) Int. Cl.
*C30B 25/00* (2006.01)
*C30B 28/12* (2006.01)
*H01L 21/28* (2006.01)

(52) U.S. Cl. .............. 117/95; 117/97; 117/83; 117/84; 117/85; 438/604; 438/605; 438/606

(58) Field of Classification Search .......... 117/95, 117/97, 81–87; 257/E21.101; 438/22, 604–606
See application file for complete search history.

(56) References Cited

U.S. PATENT DOCUMENTS

| 5,729,043 A | * | 3/1998 | Shepard | 257/519 |
| 5,872,045 A | * | 2/1999 | Lou et al. | 438/432 |
| 6,214,126 B1 | * | 4/2001 | Miyoshi et al. | 134/2 |
| 6,251,747 B1 | * | 6/2001 | Zheng et al. | 438/424 |
| 6,458,494 B2 | * | 10/2002 | Song et al. | 430/5 |
| 6,475,882 B1 | * | 11/2002 | Sakai et al. | 438/483 |

(Continued)

FOREIGN PATENT DOCUMENTS

EP  1 528 590 A2  5/2005

(Continued)

OTHER PUBLICATIONS

P.R. Hageman, et al; "High Quality GaN Layers on Si(111) Substrates: AlN Buffer Layer Optimisation and Insertion of a SiN Intermediate Layer", Phys. Stat. Sol. (a) 188, No. 2, pp. 523-526, Aug. 4, 2001.

(Continued)

*Primary Examiner*—G. Nagesh Rao
(74) *Attorney, Agent, or Firm*—Ladas & Parry LLP

(57) ABSTRACT

Provided is a method for preparing a substrate for growing gallium nitride and a gallium nitride substrate. The method includes performing thermal cleaning on a surface of a silicon substrate, forming a silicon nitride ($Si_3N_4$) micro-mask on the surface of the silicon substrate in an in situ manner, and growing a gallium nitride layer through epitaxial lateral overgrowth (ELO) using an opening in the micro-mask. According to the method, by improving the typical ELO, it is possible to simplify the method for preparing the substrate for growing gallium nitride and the gallium nitride substrate and reduce process cost.

6 Claims, 3 Drawing Sheets

U.S. PATENT DOCUMENTS

| | | | |
|---|---|---|---|
| 7,118,929 B2* | 10/2006 | Frayssinet et al. | 438/22 |
| 2002/0008080 A1* | 1/2002 | Song et al. | 216/51 |
| 2002/0190259 A1* | 12/2002 | Goetz et al. | 257/79 |
| 2005/0285141 A1* | 12/2005 | Piner et al. | 257/192 |
| 2009/0087967 A1* | 4/2009 | Todd | 438/507 |
| 2009/0104782 A1* | 4/2009 | Lu et al. | 438/715 |
| 2009/0230508 A1* | 9/2009 | Dyer et al. | 257/532 |
| 2009/0236691 A1* | 9/2009 | Dyer et al. | 257/532 |

FOREIGN PATENT DOCUMENTS

| | | |
|---|---|---|
| KR | 0138849 B1 | 6/1998 |
| KR | 20010062407 A | 7/2001 |

OTHER PUBLICATIONS

Satoru Tanaka, et al; "Anti-Surfactant in III-Nitride Epitaxy-Quantum Dot Formation and Dislocation Termination", Jpn. J. Appl. Phys., vol. 39, Aug. 15, 2000, pp. L831-L834.

* cited by examiner

×100

METHOD FOR PREPARING SUBSTRATE FOR GROWING GALLIUM NITRIDE AND METHOD FOR PREPARING GALLIUM NITRIDE SUBSTRATE

CROSS-REFERENCE TO RELATED APPLICATION

This application claims priority to Korean Patent Application No. 2007-0091899 filed on Sep. 11, 2007 and all the benefits accruing therefrom under 35 U.S.C. §119, the contents of which are incorporated by reference in their entirety.

BACKGROUND

The present disclosure relates to a single crystal layer formed of gallium nitride (GaN) or a nitride of gallium and other metal, and a method for forming the single crystal layer. The present disclosure also relates to a method for preparing a substrate used in manufacturing electronic or photo-electronic devices including the single crystal layer. The present disclosure pertains to a technical field for forming a nitride based semiconductor material layer on a substrate, and more particularly, to a technical field for preparing a substrate for forming a high quality nitride based semiconductor layer.

Semiconductors based on nitrides of Group III elements or Group V elements already hold important positions in electronic and photo-electronic fields, which will be important more and more. In fact, the nitride based semiconductors may be used in a wide range of fields from laser diodes (LD) to transistors operating at high frequency and high temperature. The nitride based semiconductors may also be used in ultraviolet photo-detectors, surface acoustic wave detectors and light emitting diodes.

Particularly, gallium nitride is widely known for its usefulness in blue light emitting diodes and high frequency and high temperature transistors. However, it is also being extensively researched for use in microelectronic devices. As used herein, gallium nitride includes gallium nitride alloys such as aluminum gallium nitride (AlGaN), indium gallium nitride (InGaN) and aluminum indium gallium nitride (AlInGaN).

To grow a gallium nitride layer of low defect density is important in manufacturing gallium nitride microelectronic devices. One of the causes known to generate the defects is a substrate on which gallium nitride is grown. However, it is difficult to prepare a gallium nitride substrate or a substrate for growing gallium nitride without defects. Since the gallium nitride is difficult to melt, typical methods such as Czochralski method where the crystal is grown from a melt cannot be used in producing gallium nitride single crystal for the substrate. Surely, gallium nitride can be molten under ultrahigh pressure, however, this is currently unavailable for commercial use due to the low productivity.

Therefore, in such devices, the most frequently used for growing the gallium nitride layer are sapphire substrate, and next, a silicon carbide (SiC) substrate. However, sapphire is an electric insulator and a poor thermal conductor, and silicon carbide is expensive and has variable quality.

Accordingly, silicon has been proposed as a substitute for sapphire and silicon carbide. Surely, silicon is economically and technologically attractive in comparison to sapphire and silicon. Particularly, silicon is a good thermal conductor and may be easily removed. In addition, silicon is preferred as a substrate material for low cost mass production. This is because there has been developed a silicon based technology system that can be controlled perfectly in industry scale, and a silicon substrate can be manufactured at a much lower cost than the sapphire substrate and the silicon carbide substrate. However, gallium nitride is difficult to grow on the silicon substrate because of the great difference in lattice constant and thermal expansion coefficient between silicon and gallium nitride.

Recently, epitaxial lateral overgrowth (ELO) method is widely used to grow a high quality gallium nitride layer that determines internal quantum efficiency. The ELO method is being used for manufacturing high speed devices such as blue laser diodes, ultraviolet laser diodes, high temperature/high power devices, high electron mobility transistors (HEMT), and hetero-junction bipolar transistors (HBT), by homoepitaxy.

In a typical ELO method, a stripe-shaped silicon dioxide ($SiO_2$) mask is used to reduce stress caused by the lattice mismatch and the thermal expansion coefficient difference between the substrate and the gallium nitride layer. The typical ELO method will be described below with reference to FIG. 1, which shows a cross-sectional view of the substrate for growing gallium nitride according to the typical ELO method.

In the typical ELO method, the gallium nitride layer 2 is grown on the substrate 1 in a furnace. Then, the substrate 1 is taken out of the furnace. After depositing silicon dioxide on the gallium nitride layer in a deposition apparatus, the substrate 1 is taken out of the deposition apparatus. The silicon dioxide layer is patterned using a photolithography technique to form a silicon dioxide mask 3 on the gallium nitride layer 2, and then the substrate 1 is placed again in the furnace so that an ELO gallium nitride layer 4 is grown on the gallium nitride layer 2.

A portion of the ELO gallium nitride layer 4 that is laterally grown over the silicon dioxide mask 3 has relatively high quality compared to a vertically grown portion. This is because it is difficult to propagate defects such as dislocations through the laterally grown portion. Therefore, by forming a device in the portion of the ELO gallium nitride layer 4 that is laterally grown over the silicon dioxide mask 3, excellent properties can be obtained.

However, the ELO method requires the above described complex process such as an additional external process for forming the silicon dioxide mask, increasing process time and process cost. In addition, recently, as a plurality of silicon dioxide masks are used to improve and enlarge the function of the ELO, the number of the processes of forming the silicon dioxide mask and growing the gallium nitride layer is also increased correspondingly. Consequently, this may result in increased process cost, process complexity, time loss and economical loss, and thus in decreased process yield.

SUMMARY

The present disclosure provides a simple and cost-effective method for preparing a substrate for growing gallium nitride and a gallium nitride substrate through improved epitaxial lateral overgrowth (ELO).

According to an exemplary embodiment, the method for preparing the substrate for growing gallium nitride and the gallium nitride substrate includes performing thermal cleaning on a surface of a silicon substrate, forming a silicon nitride ($Si_3N_4$) micro-mask on the surface of the silicon substrate in an in situ manner, and growing a gallium nitride layer through epitaxial lateral overgrowth (ELO) using an opening in the micro-mask.

The method for preparing the gallium nitride substrate further includes obtaining the gallium nitride substrate by interrupting the growing of the gallium nitride layer, taking the silicon substrate on which the gallium nitride layer is grown out of a furnace, and removing the substrate and the micro-mask.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
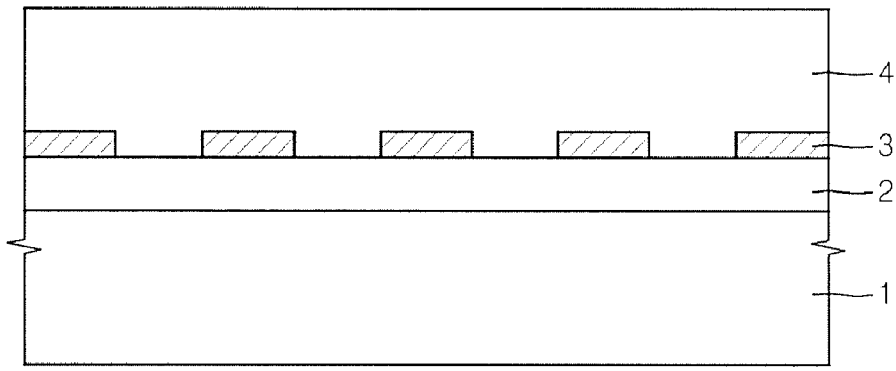
FIG. 1 is a cross-sectional view of a substrate for growing gallium nitride according to a typical ELO method.

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the shapes of elements are exaggerated for clarity of illustration, and like reference numerals refer to like elements throughout. It will be appreciated by those skilled in the art that when an element such as a layer is referred to as being 'on/under' other element herein, it may be directly on/under other element, and one or more intervening elements may also be present.

Figure 2:
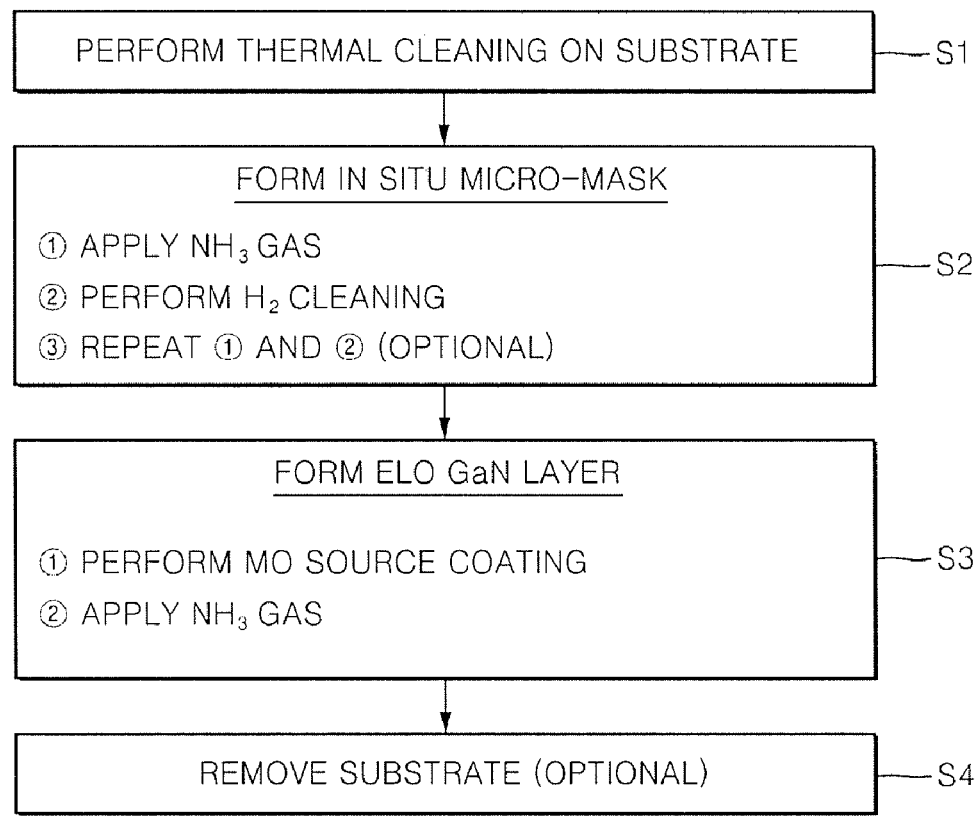
FIG. 2 is a flowchart illustrating methods for preparing a substrate for growing gallium nitride and a gallium nitride substrate according to an exemplary embodiment.
Figure 3:
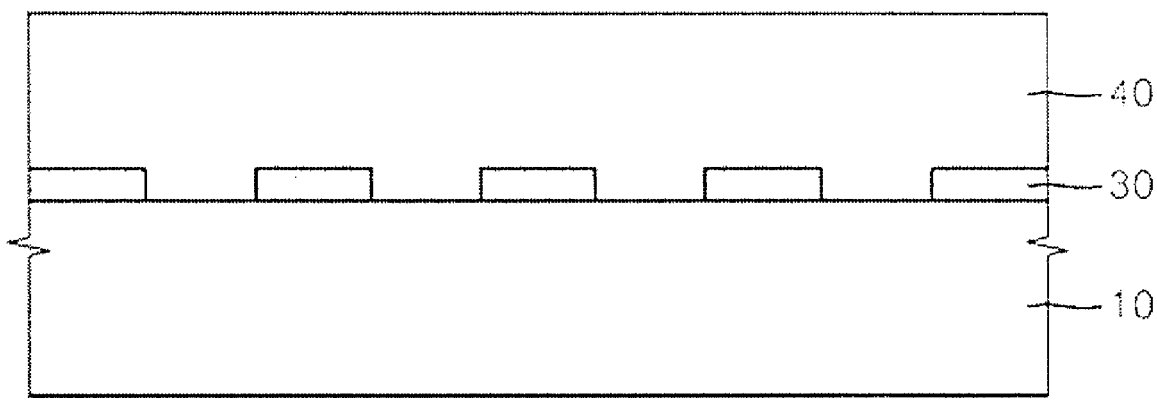
FIG. 3 is a cross-sectional view of the substrate prepared according to the exemplary embodiment.

FIG. 2 is a flowchart illustrating methods for preparing a substrate for growing gallium nitride and a gallium nitride substrate according to an exemplary embodiment. FIG. 3 is a cross-sectional view of the substrate prepared according to the exemplary embodiment.

In operation S1, a silicon substrate 10 is placed in a furnace for growing gallium nitride to perform thermal cleaning on a surface of the silicon substrate 10 as shown in FIGS. 2 and 3.

The thermal cleaning is performed to remove a naturally formed silicon dioxide layer of a thickness from a few angstroms to tens of angstroms from the substrate 10. The thermal cleaning is typically performed for a few minutes to tens of minutes at a high temperature above approximately 1,000° C. Resultantly, a dangling bond on the substrate 10 is terminated in silicon so that the substrate is put in a state suitable for a subsequent thin layer growth.

Thereafter, in operation S2, a silicon nitride ($Si_3N_4$) micro-mask 30 is formed on the substrate 10 still in the furnace, i.e., in an in situ manner.

In more detail, ammonia ($NH_3$) is applied to a surface of the substrate 10 in the furnace so that the ammonia is reacted with the substrate 10 to form a silicon nitride layer. The condition for forming the silicon nitride layer may be identical to or different from that of the operation S1. For example, the temperature may be identical to, slightly higher than (e.g., approximately 30° C. higher than), or slightly lower than (e.g., approximately 30° C. lower than) that of the operation S1.

Thereafter, hydrogen ($H_2$) is applied into the furnace to perform hydrogen cleaning on the substrate 10. The silicon nitride layer is very thin and the surface thereof is very rough. The hydrogen applied to the surface of the silicon nitride layer preferentially etches weak connections (for example, portions of a relatively small thickness or a relatively low binding strength) in the silicon nitride layer. As a result, certain portions of the silicon nitride layer are etched to form openings.

Such openings formed by the hydrogen etching are randomly distributed. The depths of the openings can be controlled by varying cleaning time, temperature, and pressure. For example, it is possible that the silicon nitride layer is formed at a temperature slightly lower than (e.g., approximately 30° C. lower than) that of the operation S1 and the hydrogen cleaning is performed at a temperature slightly higher than (e.g., approximately 30° C. higher than) that of the operation S1.

The operation S2 for forming the micro-mask 30 may be performed at a temperature identical to or slightly higher or lower than that of the operation S1 for performing the thermal cleaning. Accordingly, regarding that the operation S1 is performed at a high temperature, typically above approximately 1,000° C., the operation S2 for forming the micro-mask 30 may be performed at a temperature of approximately 1,000° C., particularly, at a temperature range from approximately 900° C. to approximately 1,100° C. If the operation temperature of the operation S2 is lower than 900° C., the silicon nitride layer is difficult to form, and if the operation temperature is higher than 1,100° C., it would be too costly to maintain the high temperature.

The applying of the ammonia and the hydrogen cleaning may be repeatedly performed as occasion demands. After the applying of the ammonia for regrowing the silicon nitride layer, the portions where the openings existed have smaller thicknesses than the other portions. As a result, in a subsequent hydrogen cleaning, the relatively thin portions are etched again. Accordingly, by repeating the applying of the ammonia and the hydrogen cleaning, the sizes of the openings can be controlled while maintaining the positions thereof. That is, by controlling the number of the applying of the ammonia and the hydrogen cleaning, the sizes of the openings and the like can be controlled. Here, the repetition of the applying of the ammonia and the hydrogen cleaning is optional.

Figure 4:
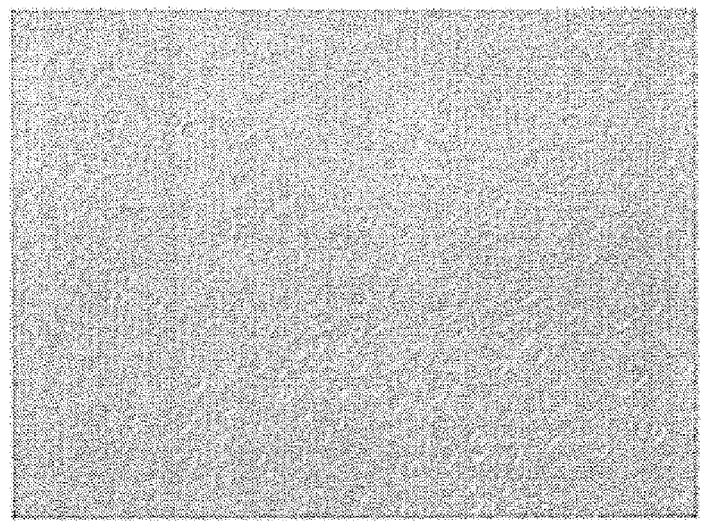
FIGS. 4 and 5 are optical microscope images of a micro-mask formed according to the exemplary embodiment.
Figure 5:
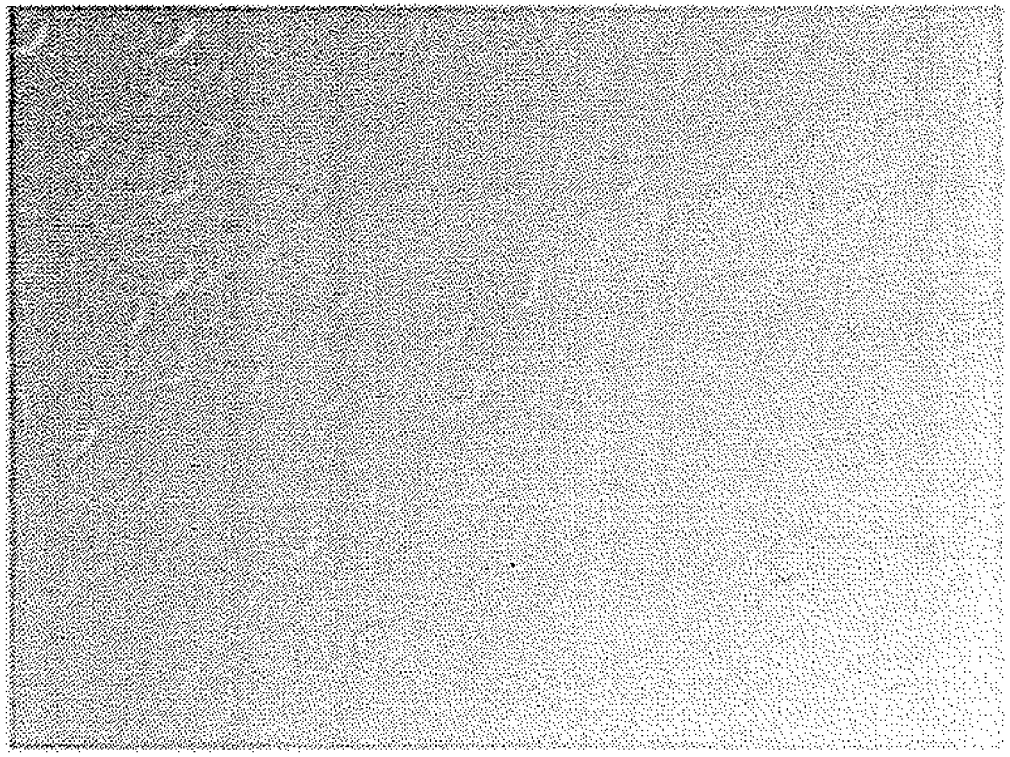

FIGS. 4 and 5 are optical microscope images of the micro-mask formed according to the exemplary embodiment. The micro-mask was formed according to the above described operation S2. Here, during the operation S2, the temperature was controlled to be identical to that of the operation S1.

FIG. 4 was taken at a magnification of 200, and FIG. 5 was taken at a magnification of 100. As shown in FIGS. 4 and 5, a micro-mask with openings of predetermined sizes is formed in an in situ manner.

Thereafter, in operation S3, a gallium nitride layer 40 is grown through epitaxial lateral overgrowth (ELO) using the openings of the micro-mask 30. The gallium nitride layer 40 may be grown through metal-organic chemical vapor deposition (MOCVD), molecular beam epitaxy (MBE), hydride vapor phase epitaxy (HVPE), or the like.

The MOCVD may include applying to the surface of the substrate 10 a metal organic (MO) source including gallium (Ga), such as trimethyl gallium (TMGa), triethyl gallium (TEGa) and gallium chloride ($GaCl_3$), and applying thereto a nitrogen-containing gas, such as nitrogen ($N_2$), ammonia and tertiarybutylamine ($N(C_4H_9)H_2$). The MO source and the nitrogen-containing gas are applied sequentially, however, after the gallium nitride is grown to above a predetermined thickness, they may be applied simultaneously. Here, nitrogen gas may be used as a carrier gas.

Which of the MO source and the nitrogen-containing gas will be applied first may be determined according to the kind of the substrate 10. In general, for a silicon substrate, in order to prevent the formation of the silicon nitride, the MO source is applied first to coat it on the substrate 10, and then the nitrogen-containing gas such as ammonia is applied.

However, for a typical sapphire substrate, the nitrogen-containing gas such as ammonia is applied first, so that aluminum in the sapphire substrate is reacted with nitrogen in the nitrogen-containing gas to form a thin aluminum nitride (AlN) buffer layer (intermediate layer). Thereafter, the MO source is applied thereto.

As described above, in the typical method, ammonia is applied in an early stage of the growing of the gallium nitride, which may form amorphous or polycrystalline silicon nitride on the substrate, decreasing the quality of the thin layer. However, according to the exemplary embodiment, the ammonia is applied subsequently after or during the high temperature thermal cleaning to form the silicon nitride for use as a mask.

In addition, the gallium nitride layer 40 may be grown using the HVPE performed at a temperature of approximately 1,000° C. to approximately 1,100° C. and a pressure of approximately 1 atm. The HVPE is a kind of vapor phase epitaxy. In HVPE a gas is applied to the substrate 10 to grow a crystal through the reaction of the gases. A vessel containing gallium is placed in a furnace and then heated by a heater around the vessel to melt the gallium. The gallium melt is reacted with hydrogen chloride (HCl) to produce gallium chloride (GaCl) gas. The gallium chloride gas is reacted with ammonia to form gallium nitride. Through the HVPE, a thick layer can be grown at a high growth rate of approximately 100 µm/hr, providing high productivity.

Nucleation and growth of the gallium nitride layer 40 occur selectively in the openings. Thereafter, due to the ELO, the lateral growth fronts coalesce with each other over the micro-mask 30, and then, the gallium nitride layer 40 further extends upwardly. As such, even a thick layer of a thickness greater than approximately 100 µm can be formed. The resulting gallium nitride layer has good quality and no cracks. It is obvious that as the gallium nitride layer 40 becomes thicker, the structural, optical and electrical properties thereof are improved.

The above described substrate 10 on which the gallium nitride layer 40 is grown can itself be used in manufacturing nitride based optical devices and electronic devices because the thick and crack-free gallium nitride layer 40 is included therein. Particularly, when using the MOCVD, generally a device-grade gallium nitride layer of a thickness from approximately 1 µm to approximately 3 µm may be grown on the substrate 10 for use in the manufacturing of the nitride based optical devices and electronic devices.

However, when using a bulk growth method such as HVPE, the gallium nitride layer 40 can be grown to a thickness above approximately 100 µm. Accordingly, it is possible to obtain a free standing gallium nitride substrate by interrupting the growth of the gallium nitride, taking the substrate 10 on which the gallium nitride layer 40 is grown out of the furnace, removing the substrate 10 and the micro-mask 30 using a physical/chemical method such as etching and polishing so that only the gallium nitride layer 40 remains, in operation S4. In addition, using the micro-mask 30 as a physical and mechanical weak point, the substrate 10 can be easily separated from the gallium nitride layer 40 by applying only a physical and mechanical force thereto, without the need of complicated processes such as etching and polishing.

According to the exemplary embodiments, it is possible to omit the process for preparing a complicated silicon dioxide mask in the typical ELO method. In addition, it is possible to perform the ELO method in an in situ manner, i.e., without taking the substrate out of the furnace for growing gallium nitride, throughout the process. Therefore, the exemplary embodiments provide not only the advantages of the in situ process, but also the economical effect, of removing the complicated process for preparing the silicon dioxide mask. As a result, it is possible to reduce the process time and the process cost, and it is also possible to increase the process yield due to the simplified process.

Particularly, by using a silicon substrate, even a large wafer larger than 12 inches can be manufactured, and thus it is possible to reduce the process cost further and significantly extend the application range of the gallium nitride device.

Although the method for preparing a substrate for growing gallium nitride and the method for preparing a gallium nitride substrate has been described with reference to the specific embodiments, they are not limited thereto. Therefore, it will be readily understood by those skilled in the art that various modifications and changes can be made thereto without departing from the spirit and scope of the present invention defined by the appended claims. For example, although the silicon substrate and the silicon nitride micro-mask have been described in the exemplary embodiments, the present invention is not limited thereto. That is, the substrate may be any single crystal substrate suitable for growing gallium nitride. For example, the substrate may be a sapphire single crystal substrate, a gallium arsenide (GaAs) single crystal substrate, a spinel single crystal substrate, an indium phosphide (InP) single crystal substrate, a silicon carbide single crystal substrate, or a gallium nitride single crystal substrate. Furthermore, such single crystals may be covered with a thin gallium nitride buffer layer. Here, a material for the micro-mask which will be formed on the substrate in an in situ manner according to the material for the substrate can be easily construed by those skilled in the art by simply modifying the embodiments without departing from the spirit and scope of the present invention defined by the appended claims.

In the specification and drawings, there have been set forth exemplary embodiments of the invention which have been included by way of example and not by way of limitation. The scope of the invention is defined not by the detailed description but by the appended claims, and all differences within the scope will be construed as being included in the present invention.

What is claimed is:

1. A method for preparing a substrate for growing gallium nitride, the method comprising:
   performing thermal cleaning on a surface of a silicon substrate;
   forming a silicon nitride ($Si_3N_4$) micro-mask having one or more openings on the surface of the silicon substrate in an in situ manner comprising:
      forming an $Si_3N_4$ thin film on the surface of the silicon substrate in an in situ manner by applying ammonia ($NH_3$) to the surface of the silicon substrate; and
      etching one or more portions of the $Si_3N_4$ thin film by applying hydrogen ($H_2$) to the surface of the $Si_3N_4$ thin film so as to expose the silicon substrate surface through one or more openings corresponding to the one or more etched portions; and
   growing a gallium nitride layer through epitaxial lateral overgrowth (ELO) using an opening in the micro-mask.

2. The method of claim 1, wherein the performing of the thermal cleaning comprises removing a natural oxide layer on the surface of the silicon substrate.

3. The method of claim 1, wherein the $Si_3N_4$ micro-mask is formed by repeatedly performing: forming the $Si_3N_4$ thin film on the surface of the silicon substrate by applying $NH_3$ to the surface of the silicon substrate; and etching the one or more portions of the $Si_3N_4$ thin film by applying $H_2$ to the surface of the $Si_3N_4$ thin film.

4. The method of claim 3, wherein the forming of the silicon nitride ($Si_3N_4$) micro-mask is performed at a temperature ranging from approximately 900° C. to approximately 1,100° C.

5. The method of claim 1, wherein the growing of the gallium nitride layer comprises:
   applying a metal organic (MO) source containing gallium (Ga) to the surface of the silicon substrate; and
   applying a nitrogen-containing gas to the surface of the silicon substrate.

6. A method for preparing a gallium nitride substrate, the method comprising:
   performing thermal cleaning on a surface of a silicon substrate;
   forming a silicon nitride ($Si_3N_4$) micro-mask having one or more openings on the surface of the silicon substrate in an in situ manner comprising:
      forming an $Si_3N_4$ thin film on the surface of the silicon substrate in an in situ manner by applying ammonia ($NH_3$) to the surface of the silicon substrate; and
      etching one or more portions of the $Si_3N_4$ thin film by applying hydrogen ($H_2$) to a surface of the $Si_3N_4$ thin film so as to expose the silicon substrate surface through one or more opening corresponding to the one or more etched portions;
   growing a gallium nitride layer through epitaxial lateral overgrowth (ELO) using an opening in the micro-mask; and
   obtaining the gallium nitride substrate by interrupting the growing of the gallium nitride layer, taking the silicon substrate on which the gallium nitride layer is grown out of a furnace, and removing the substrate and the micromask.

* * * * *